United States Patent [19]

Chakravorty et al.

[11] Patent Number: 4,974,048

[45] Date of Patent: Nov. 27, 1990

[54] INTEGRATED CIRCUIT HAVING REROUTABLE CONDUCTIVE PATHS

[75] Inventors: Kishore K. Chakravorty, Issaquah; Peter L. Young, Mercer Island, both of Wash.

[73] Assignee: The Boeing Company, Seattle, Wash.

[21] Appl. No.: 321,911

[22] Filed: Mar. 10, 1989

[51] Int. Cl.[5] .................. H01L 27/020; H01L 27/140
[52] U.S. Cl. .......................... 357/40; 357/30; 357/45
[58] Field of Search .............. 357/40, 41, 19, 28, 357/29, 30, 45; 350/96.2; 29/847; 156/47, 48

[56] References Cited

U.S. PATENT DOCUMENTS

| | | | |
|---|---|---|---|
| 3,259,750 | 7/1966 | Volkmann | 357/40 |
| 3,378,920 | 4/1968 | Cone | 29/847 |
| 3,555,365 | 1/1971 | Forlani et al. | 29/847 |
| 3,795,974 | 3/1974 | Calhoun | 29/574 |
| 3,861,023 | 1/1975 | Bennett | 29/574 |
| 4,240,094 | 12/1980 | Mader | 357/45 |
| 4,259,367 | 3/1981 | Dougherty, Jr. | 427/96 |
| 4,581,628 | 4/1986 | Miyauchi et al. | 357/71 |
| 4,630,355 | 12/1986 | Johnson | 29/575 |
| 4,661,214 | 4/1987 | Young | 204/15 |
| 4,673,966 | 6/1987 | Shimoyama | 357/45 |
| 4,681,778 | 7/1987 | Young | 427/96 |
| 4,689,654 | 8/1987 | Brockmann | 357/45 |
| 4,691,434 | 9/1987 | Percival et al. | 437/173 |
| 4,703,436 | 10/1987 | Varshney | 364/490 |
| 4,720,470 | 1/1988 | Johnson | 437/173 |
| 4,855,871 | 8/1989 | Young | 361/411 |

OTHER PUBLICATIONS

R. F. Broom and A. Moser, Discretionary Interconnection Method for Integrated Circuits, Apr. 1972, 3549–3550.

*Primary Examiner*—Rolf Hille
*Assistant Examiner*—Peter Toby Brown
*Attorney, Agent, or Firm*—Christensen, O'Connor, Johnson & Kindness

[57] ABSTRACT

An integrated circuit that may be modified or repaired following its fabrication. The integrated circuit (80/80'/80") includes two chips (82, 84) having terminals (88, 90, 92, 94, 96, and 98), which are interconnected by first conductors (100, 102, 108, 110, 114, and 116) and second conductors (104, 112, and 118). Switchable connectors (126, 128) can be selectively activated to convey current through portions of two bus conductors (120, 122), and/or through a redundant line (124), to interconnect specific terminals of the two chips in order to bypass a break or short circuit in the first and second conductors. In addition, switchable disconnectors (134, 136) may be selectively activated to create discontinuity in specific conductors. A focused laser beam (162) is used to activate selected switchable connectors and disconnectors by heating them, thereby changing the current path interconnecting the terminals of the two chips.

30 Claims, 7 Drawing Sheets

INTEGRATED CIRCUIT HAVING REROUTABLE CONDUCTIVE PATHS

TECHNICAL FIELD

This invention generally pertains to an integrated circuit (IC) including a plurality of interconnected components, and more specifically, to an IC that includes elements for modifying the circuit after it is fabricated.

BACKGROUND OF THE INVENTION

The circuitry used to interconnect components mounted on a silicon substrate is more susceptible to faults as the number of components and density of circuit traces fabricated on the substrate increases. This problem is particularly significant in the fabrication of multi-chip modules formed on a single IC substrate. Any significant defect that occurs during the fabrication of an IC will normally result in it being discarded as usuable. To minimize fatal defects, IC circuit designers often include redundant components on the silicon substrate and may even provide a redundant interconnecting conductor for each of the conductors comprising the active circuit. Clearly, this level of redundancy doubles conductor density and is generally unacceptable as requirements for circuit density increase beyond a certain level.

Alternatively, it would seem that the yield rate of high density ICs might be improved by repairing defects in the circuit. While techniques already exist for modifying an IC after it is fabricated, such modifications are generally limited to disconnection and rerouting of conductor lines *at the surface* of the IC, using a focused laser beam. This technique is ineffective with interconnection schemes employing multiple signal planes in which fractional mil wide conductor lines are packed at relatively high density and are fully encapsulated within the IC package.

The two most common faults in a high density IC are broken or open conductive traces and short circuits between adjacent traces. To be effective, any provisions for repairing an IC should permit shorted conductors to be disconnected and circuit paths to be rerouted around open traces—all within signal planes that are disposed well below the surface of the IC. In addition, the interconnecting circuitry of the IC should permit minor modifications to correct circuit design errors that have been implemented, e.g., to correct design errors in prototypes.

In consideration of the foregoing, it is an object of this invention to economically reroute interconnections around circuit defects and faults in an IC, without sacrificing the level of integration in the device or degrading its performance. A further object is to provide an IC that incorporates an integral facility to replace any defective conductor, but does not require a redundant conductor for each signal carrying conductor. Yet a further object is to disconnect and reroute around defective conductors by changing connections at sites that are buried within the IC. These and other objects and advantages of the present invention will be apparent from the attached drawings and by reference to the Description of the Preferred Embodiments that follows.

SUMMARY OF THE INVENTION

In accordance with the present invention, an integrated circuit including at least two components interconnected by a substantial plurality of conductive lines is provided with a repair circuit for correcting a fault in the interconnecting conductive lines and otherwise modifying the integrated circuit. The conductive lines include a plurality of generally parallel first traces disposed in a first plane, and a plurality of generally parallel second traces that are disposed in a second plane and which extend generally transverse to the first traces. Throughpads interconnect the first and second traces at selected points; at least some of the first traces are connected to terminals of the components.

The repair circuit includes a first and a second bus conductor, each extending adjacent one of the two components. The bus conductors are generally transverse to the first traces and disposed in a different plane. A redundant conductor extends between the two components, generally transverse to the second traces and disposed in a different plane. One end of the redundant conductor is electrically connected to the first bus conductor and the other end to the second bus conductor, via throughpads. Connector means, disposed within the integrated circuit, are provided for selectively electrically connecting the first traces that are connected to the terminals of one component, to the first bus conductor. Similarly, the connector means are operative to selectively electrically connect the first traces that are connected to the terminals of the other component to the second bus conductor.

Isolation means are included in the repair circuit for selectively creating an electrical discontinuity in the interconnecting conductive lines, to electrically isolate an interconnecting conductive line from the rest of the integrated circuit. In addition, the isolation means are usable for selectively creating an electrical discontinuity between the connector means and the second bus conductors, to isolate one or more sections thereof from the remainder. By selectively rerouting a signal between the terminals of the components through the redundant conductor and the first and second bus conductors using the connector means and the isolation means, the repair circuit is operable to repair a fault in the interconnecting conductive lines and to modify the integrated circuit.

The connector means include a region of a dielectric film that may be selectively changed from a non-conductive to a conductive state by heating the region using a focused energy beam. When converted to a conductive state, the region provides electrical continuity between a select first trace and a select one of the first and second bus conductors.

The isolation means include a plurality of patches formed in the interconnecting conductive lines and in the first and second bus conductors. Each patch comprises a composite film including a thin conducting layer and an insulating layer that extend across a gap formed in the interconnecting conductive lines or in the first and second bus conductors. The insulating layer is operative to absorb the conducting layer, changing the composite film to a non-conductive state, when the patch is selectively activated by heating it with a focused energy beam.

A method of modifying an integrated circuit and of repairing faults in conductors connecting terminals of two components in the integrated circuit comprises a further aspect of this invention. The method generally includes steps corresponding to the functions carried out by the elements of the repair circuit described above.

DESCRIPTION OF THE PREFERRED EMBODIMENTS

Figure 1:
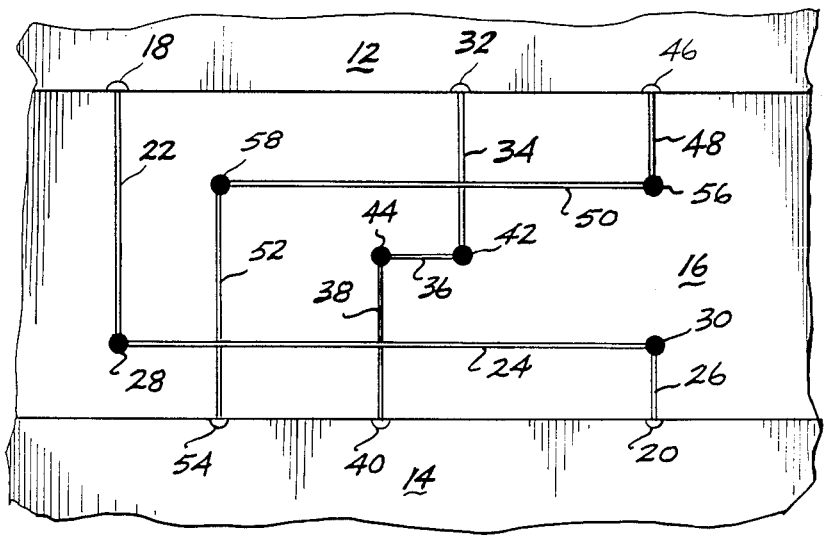
FIG. 1 is a schematic diagram of a portion of an IC, showing the prior art interconnection of terminals on two chips in a multi-chip module.

In a typical integrated circuit, a plurality of components are connected together by copper conductive lines, which are photolithographically etched from a layer of copper deposited on a silicon substrate in a vacuum chamber. (As used herein and in the attached claims, the term "integrated circuit" encompasses any type of circuit having interconnected components mounted on or within a continuous substrate, including a single chip comprising active and/or passive elements and multichip modules with two or more semiconductor chips attached to a substrate.) Recent advances have resulted in the development of high-density circuits for interconnecting a plurality of component chips formed on a single hybrid silicon wafer substrate. An example of a very small portion of such an integrated circuit, generally indicated at reference numeral 10, is shown in FIG. 1. Integrated circuit 10 illustrates the prior art approach used to interconnect two chips, identified by reference numerals 12 and 14. (Details of the circuitry of each chip are not shown.)

Terminals on chips 12 and 14 are interconnected by conductive paths or traces formed on a silicon substrate 16. In the portion of integrated circuit 10 shown in FIG. 1, a terminal 18 on chip 12 is connected to a terminal 20 on chip 14 via electrical conductors 22, 24, and 26. Conductors 22 and 26 extend along a common plane disposed below the plane on which conductor 24 is deposited. To connect conductors 22 and 26 to conductor 24, an interplane conductive path is provided by throughpads 28 and 30, disposed respectively at the interconnected ends of conductors 22 and 24, and of conductors 24 and 26. Similarly, terminals 32 and 40 are interconnected by conductors 34, 36, and 38, using throughpads 42 and 44; and a terminal 46 is connected through conductors 48, 50, and 52 to a terminal 54, with throughpads 56 and 58 providing the interplane conductive paths.

Figure 2:
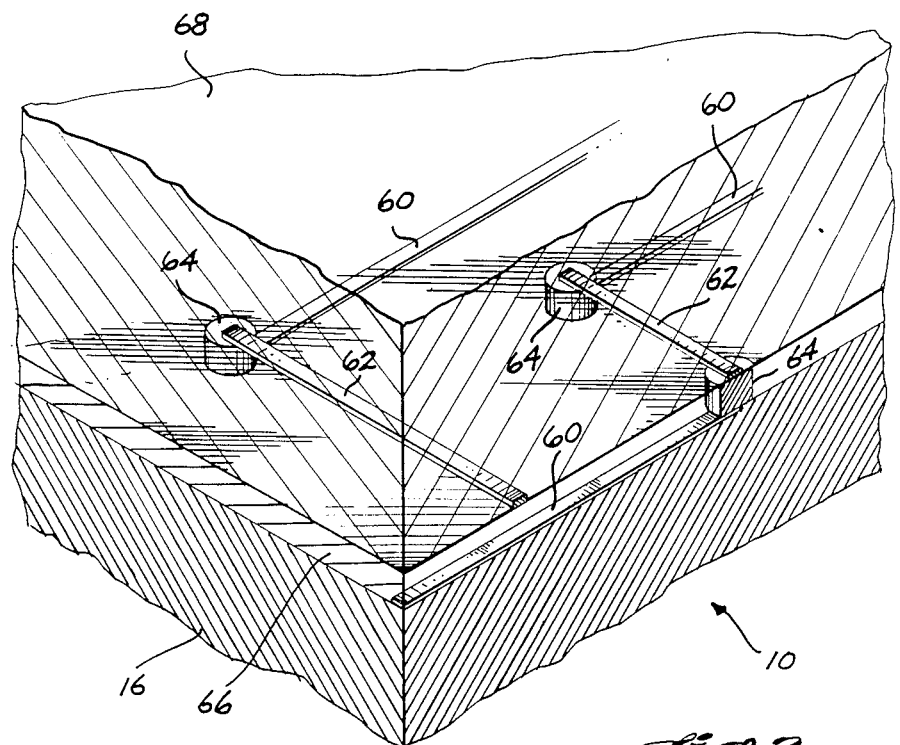
FIG. 2 is an isometric view of a portion of the prior art IC of FIG. 1, showing a plurality of conductors and throughpads applied to a silicon substrate on which the two chips are deposited.

With respect to FIG. 2, another portion of integrated circuit 10 is shown in cross-sectional isometric view to more clearly illustrate the separation between the two planes on which the conductors are deposited. As illustrated, conductors 60 extend generally parallel to each other, and are deposited directly on silicon substrate 16. A plurality of second conductors 62 extend generally parallel to each other and transverse to the longitudinal axes of first conductors 60. Second conductors 62 are deposited on top of an insulating layer 66, which separates and electrically isolates first conductors 60 from second conductors 62. Throughpads 64 are deposited on top of first conductors 60 where connection to second conductors 62 is required, providing an interplane current path between the first and second conductors. Finally, a dielectric cover layer 68 is applied to protect integrated circuit 10, insulating it both physically and electrically from outside effects.

In the high-density interconnecting circuit used in integrated circuit 10, the incidence of failure in one of the conductors interconnecting chips 12 and 14, due either to a break in the conductor or a short between two adjacent conductors, is relatively high. As indicated in the above Background of the Invention, it is not practical to provide a redundant line for each of the conductors due to the density of required current carrying conductors and inherent space limitations in the IC topology. Accordingly, the present invention represents a significant advance over prior art integrated circuit 10, by permitting repair and modification of the circuit interconnecting chips in the module, deep within dielectric cover layer 68, while avoiding the need for replicating each of the interconnecting conductors with a redundant line.

Figure 3:
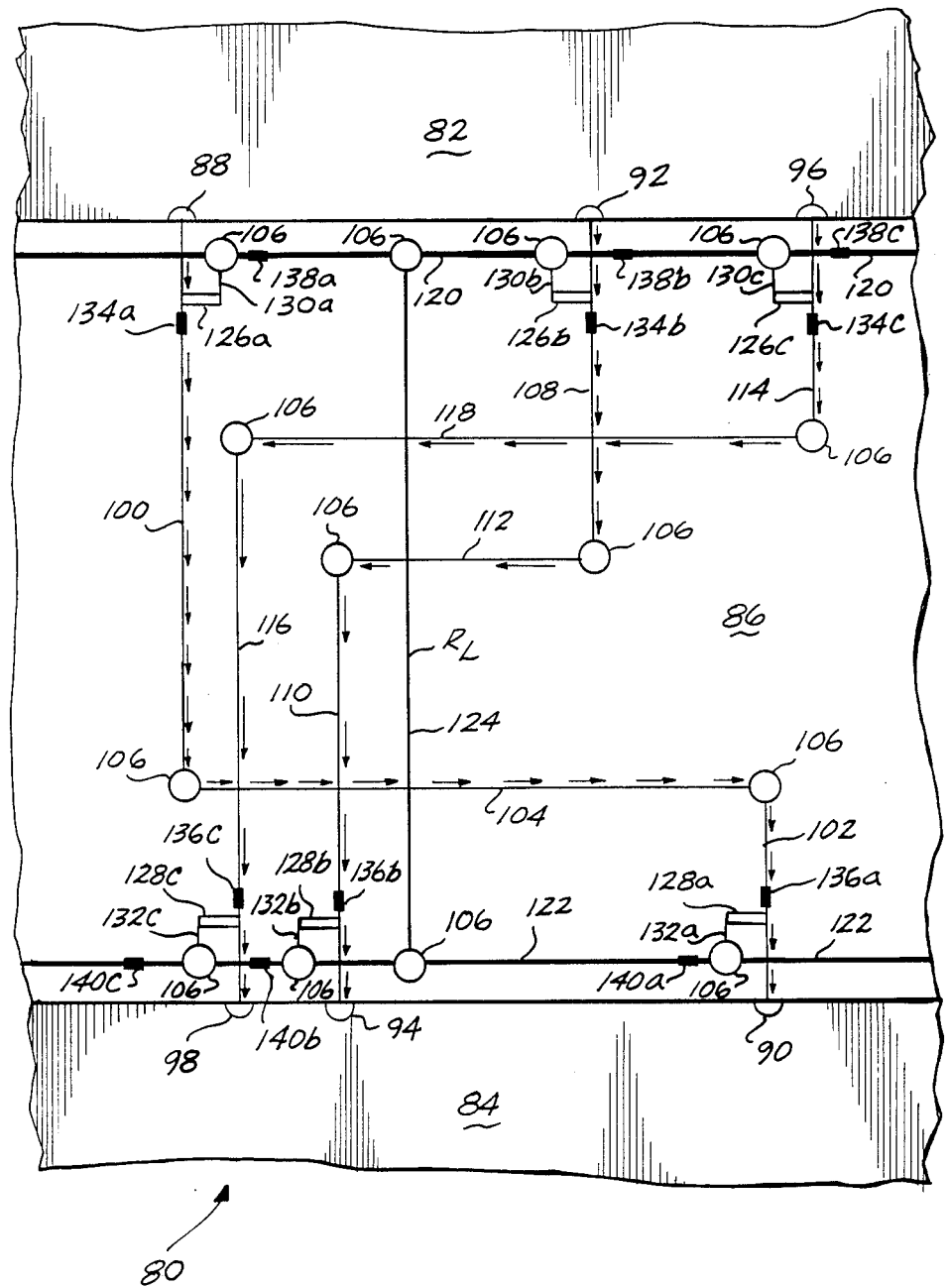
FIG. 3 is a schematic diagram illustrating a portion of an IC comprising a multi-chip module that is provided with the rerouting circuit of the present invention.

An integrated circuit configured in accordance with the present invention is shown in FIG. 3, at reference numeral 80. In the portion of integrated circuit 80 shown in this figure, terminals 88, 92, and 96 of a chip identified by reference numeral 82 are connected to terminals 90, 94, and 98 of a chip shown at reference numeral 84 by a plurality of conductive paths or traces, each comprising a copper conductor deposited on a silicon substrate 86 in much the same way as shown for the first and second conductors of integrated circuit 10 in FIG. 2. Arrows are used in FIG. 3 to show the path of current flow between the interconnected terminals; however, it will be understood that current can flow along these paths equally well in the opposite direction from that indicated by the arrows.

Terminal 88 is connected to terminal 90 by first conductors 100 and 102, and by a second conductor 104. For purposes of this disclosure, "first conductors" are defined as generally parallel aligned conductive traces lying in a common plane (shown vertically aligned in the drawing figures). The term "second conductors" refers to conductive traces that are generally aligned parallel with each other (shown horizontally aligned in the drawing figures) and transverse to the first conductors, and which lie in a common plane that is separated from the plane in which the first conductors are disposed. The first conductors and the second conductors are connected at appropriate sites by throughpads 106, which extend between the two planes, providing an interplane conductive path.

Similarly, terminal 92 is connected to terminal 94 by first conductors 108 and 110, and a second conductor 112. Likewise, terminal 96 is connected to terminal 98 by first conductors 114 and 116, and a second conductor 118. Again, throughpads 106 provide an interplane conductive path between connected first and second conductors, where appropriate.

To this point, the description of integrated circuit 80 is generally similar to that of integrated circuit 10, shown in FIG. 1. However, integrated circuit 80 differs by including a rerouting or repair circuit. The rerouting circuit comprises a bus conductor 120 disposed adjacent the terminals on chip 82 and a bus conductor 122 disposed adjacent the terminals on chip 84. Bus conductors 120 and 122 are deposited in the same plane as the second conductors, and extend generally parallel to them. The rerouting circuit also comprises a redundant line 124 that electrically connects bus conductors 120 and 122 at throughpads 106, which are disposed on each end of the redundant line. Redundant line 124 lies in the same plane as the first conductors, and is generally parallel to them.

Additional redundant lines (not shown) are provided to connect bus conductor 120 to bus conductor 122 at spaced apart intervals along their length. In the preferred embodiment, one redundant line is included for approximately every 25 conductive paths connecting terminals on chips 82 and 84, although it may be desirable to provide one redundant line for as few as ten or as many as 100 conductive paths. Since only three terminals on each of chips 82 and 84 are shown in FIG. 3, only one redundant line 124 is shown; however, it should be understood that other such redundant lines are connected to bus conductors 120 and 122 in a substantially similar manner.

A further significant difference between prior art integrated circuit 10 and integrated circuit 80 relates to the inclusion of switchable connectors 126a, 126b, and 126c, disposed respectively adjacent first conductors 100, 108, and 114, where they cross bus conductor 120. Similarly, switchable connectors 128a, 128b, and 128c are respectively disposed adjacent first conductors 102, 110, and 116, where they cross bus conductor 122. Linking connectors 130a, 130b, and 130c connect corresponding switchable connectors 126 to throughpads 106, and are coplanar with the first conductors, but are relatively shorter in length. Linking connectors 132a, 132b, and 132c connect the corresponding switchable connectors 128 to throughpads 106 on bus conductor 122. The purpose of the switchable connectors 126 and 128 is discussed below.

A plurality of switchable disconnectors 138a, 138b, and 138c are disposed adjacent throughpads 106 on bus conductor 120, where it connects to linking connectors 130. Likewise, switchable disconnectors 141a, 140b, and 140c are disposed adjacent throughpads 106 on bus conductor 122. Switchable disconnectors 134a, 134b, and 134c are disposed respectively on first conductors 100, 108, and 114, generally adjacent to the points at which switchable connectors 126 adjoin thereto. Switchable disconnectors 136a, 136b, and 136c are respectively disposed in first conductors 102, 110, and 116, adjacent the points at which the corresponding switchable connectors 128 adjoin thereto.

As shown in FIG. 3, *none* of the switchable connectors 126 and 128 provide continuity between the first conductors and the linking connectors which they adjoin. Further, again as shown in FIG. 3, all of the switchable disconnectors provide electrical continuity (i.e., they conduct electrical current), across the portion of the conductors in which they are disposed, just as if the conductor were continuous therethrough. To the extent that continuity is maintained through all of the first and second conductors shown in FIG. 3, the circuit paths provided thereby are substantially the same as in the portion of integrated circuit 10, shown in FIG. 1.

In FIG. 3 (and FIGS. 4–7), non-conducting switchable connectors are shown as long, open rectangles, and conducting switchable disconnectors are shown as filled or solid, small rectangles. When activated, the long rectangles representing the switchable connectors are shown solid, indicating that they are conductive, and the small rectangles representing the switchable disconnectors are shown open, to indicate their non-conducting state.

Figure 4:
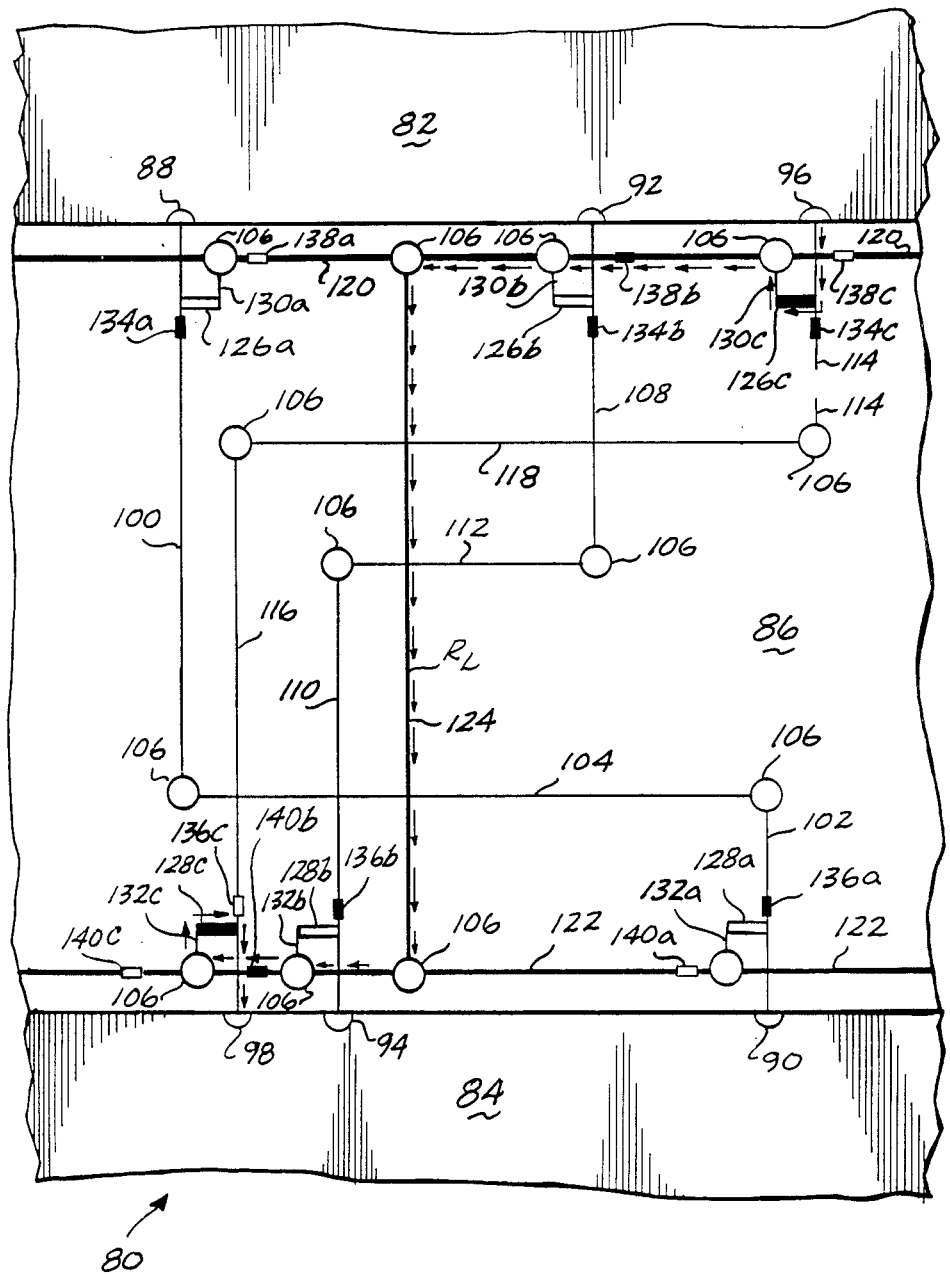
FIG. 4 schematically illustrates the circuit of FIG. 3, showing how the rerouting circuit is used to bypass a break in one of the conductive leads interconnecting terminals of the two chips.

Turning now to FIG. 4, integrated circuit 80 is again shown, but in this figure, first conductor 114 is illustrated as having a break in continuity so that current can no longer flow through it between terminal 96 on chip 82 and terminal 98 on chip 84. In the prior art integrated circuit 10 shown in FIG. 1, a break in conductor 48, which is analogous to conductor 114 in integrated circuit 80, would likely result in the failure of integrated circuit 10, making it essentially unusable. However, integrated circuit 80 can be repaired by bypassing current around the break in conductor 114 through an alternative path that makes use of redundant line 124. To divert current from conductor 114 where it connects to terminal 96, switchable connector 126c is changed from its non-conducting state as shown in FIG. 3, so that it can carry current through linking connector 130c and via throughpad 106, to bus conductor 120. Current can flow through bus conductor 120 and into redundant line 124 via the throughpad 106 that connects the two conductors. At the other end of redundant line 124, the current can flow into bus conductor 122 via another throughpad 106. At yet another throughpad 106, the current can flow from bus conductor 122 into linking connector 132c, and through a switchable connector 128c that is converted to its conducting state, into first conductor 116. Finally, the current can flow into terminal 98 from first conductor 116.

Also, as indicated in FIG. 4, switchable disconnector 136c is changed from its conducting state to its non-conducting state to electricity isolate the remainder of first conductor 116 that is connected to second conductor 118. By isolating the remainder of first conductor 116, second conductor 118, and a portion of first conductor 114, possible ringing due to the presence of an unterminated conductor segment or stub in parallel with the current path between terminals 96 and 98 is minimized. For the same reason, the portion of bus conductor 120 carrying current between terminals 96 and 98 is isolated from the remainder of bus conductor 120 by changing switchable disconnectors 138a and 138c from their conducting state to their non-conducting state. Similarly, switchable disconnectors 140a and 140c are activated to isolate the portion of bus conductor 122 carrying that current from the other portion of bus conductor 122.

Since not all of the switchable connectors in integrated circuit 80 are changed from a non-conducting to a conducting state, nor are all of the switchable disconnectors converted to a non-conductive condition, any mechanism useful to convert only *selected* switchable connectors and switchable disconnectors to their opposite state must be capable of discriminating between these elements. In fact, a preferred method for actuating the switchable connectors to an "on" or conductive condition, and the switchable disconnectors to an "off" or non-conductive condition makes use of a focused laser beam having a wavelength capable of penetrating dielectric cover layer 68 (shown in FIG. 2). Localized heating of selected switchable connectors and disconnectors with the laser beam irreversibly changes the electrical continuity of these elements and thereby alters the paths of current flow in integrated circuit 80. Details of the structure of the switchable connectors and disconnectors are explained below.

Figure 5:
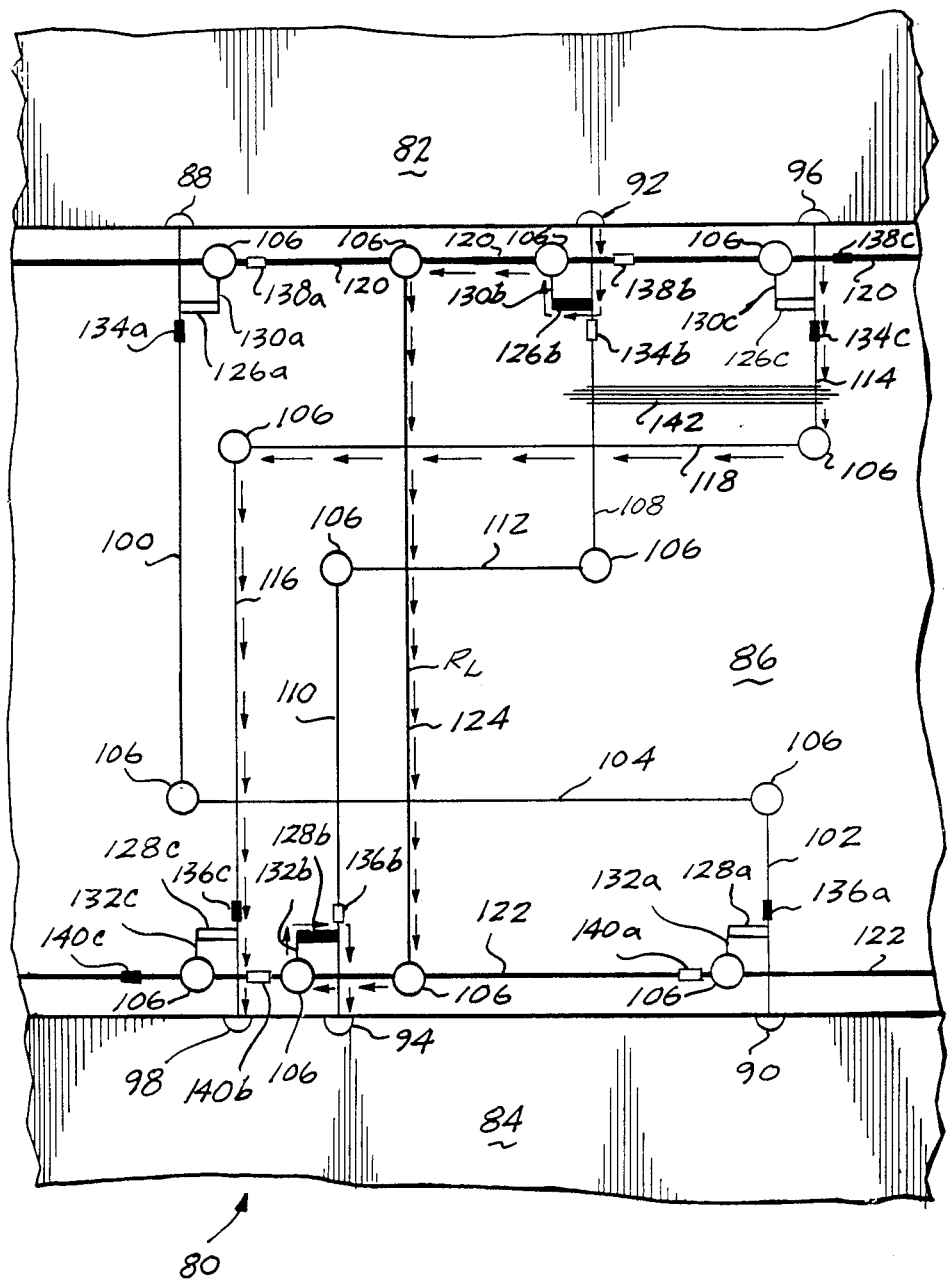
FIG. 5 schematically illustrates use of the rerouting circuit to repair a short circuit between conductive leads in the IC of FIG. 3.

In FIG. 5, integrated circuit 80 includes a fault condition caused by a short circuit, represented at an area 142, which extends between adjacent first conductors 108 and 114. Just as the break in first conductor 114 illustrated in FIG. 4 may have occurred during fabrication of the integrated circuit, so may the short circuit condition at area 142 in FIG. 5. Under normal circumstances, the existence of a short circuit between two adjacent conductive paths in an integrated circuit would very likely require it to be discarded as unusable. However, in integrated circuit 80, one of the two shorted conductive paths can be isolated from the rest of the circuit, and an alternative path provided for electric current flow between the two terminals that it normally connects.

The conductive path between terminals 96 and 98 is maintained through first conductors 114 and 116, and second conductor 118. However, the conductive path between terminals 92 and 94 is changed to make use of redundant line 124. In repairing the short circuit fault condition, switchable disconnector 134b is selectively activated to interrupt continuity through first conductor 108, and switchable connector 126b is activated so that it can carry current through linking connector 130b to bus conductor 120. In addition, switchable connector 128b is activated so that current on bus conductor 120 can be carried through redundant line 124 to bus conductor 122, and through linking connector 132b and switchable connector 128b, to first conductor 110. From first conductor 110, current can flow to terminal 94.

As further shown in FIG. 5, switchable disconnector 136b is activated, breaking continuity to the remaining portion of first conductor 110, and isolating it from the remainder of the circuit. Switchable disconnectors 138a and 138b on bus conductor 120 are also activated to minimize the portion of bus conductor 120 used for carrying current between terminals 92 and 94. In a similar fashion, switchable disconnectors 140a and 140b are activated to isolate the portion of bus conductor 122 that carries this current, from the remainder of bus conductor 122.

Instead of a single switchable disconnector on each first and second conductor, multiple such switchable disconnectors can be provided. For example, in the present embodiment, an additional switchable disconnector disposed on first conductor 108 between area 142 and lower throughpad 106 may be activated to disconnect the remainder of first conductors 108 and 110 and second conductor 112 from first conductor 114.

Since only a portion of bus conductors 120 and 122 are used to carry current to repair either a break or short in the first and second conductors, it will be apparent that a second break or short circuit fault condition occuring at another point in the conducting paths between chips 82 and 84 can be similarly repaired using a second redundant line and other portions of bus conductor 120 and 122. Furthermore, it is not necessary that the second break in the conductor or short circuit fault condition between two conductors occur at least 25 terminals apart from the first. In fact, breaks in two adjacent first or second conductors or two adjacent short circuit faults or a short circuit fault adjacent a break may be repaired using two redundant lines and two separate portions of each of bus conductors 120 and 122 that have been isolated from each other by activation of appropriate switchable disconnectors 138 and 140.

In a variant embodiment of integrated circuit 80 (not shown), multiple bus conductors could be provided adjacent the terminals on each of chips 82 and 84, rather than the single bus conductors 120 and 122. These multiple bus conductors would each be connected to the first conductors of chips 82 and 84 using switchable connectors, linking connectors, and throughpads, and provided with switchable disconnectors, in the same manner as was described above with respect to bus conductors 120 and 122. In the event of breaks or short circuits in a large number of adjacent first/second conductors, the multiple bus conductors could be used in conjunction with two or more redundant lines provided in the circuit to route signals around the defects, by activating appropriate switchable connectors and disconnectors, generally in the manner described above.

Figure 6:
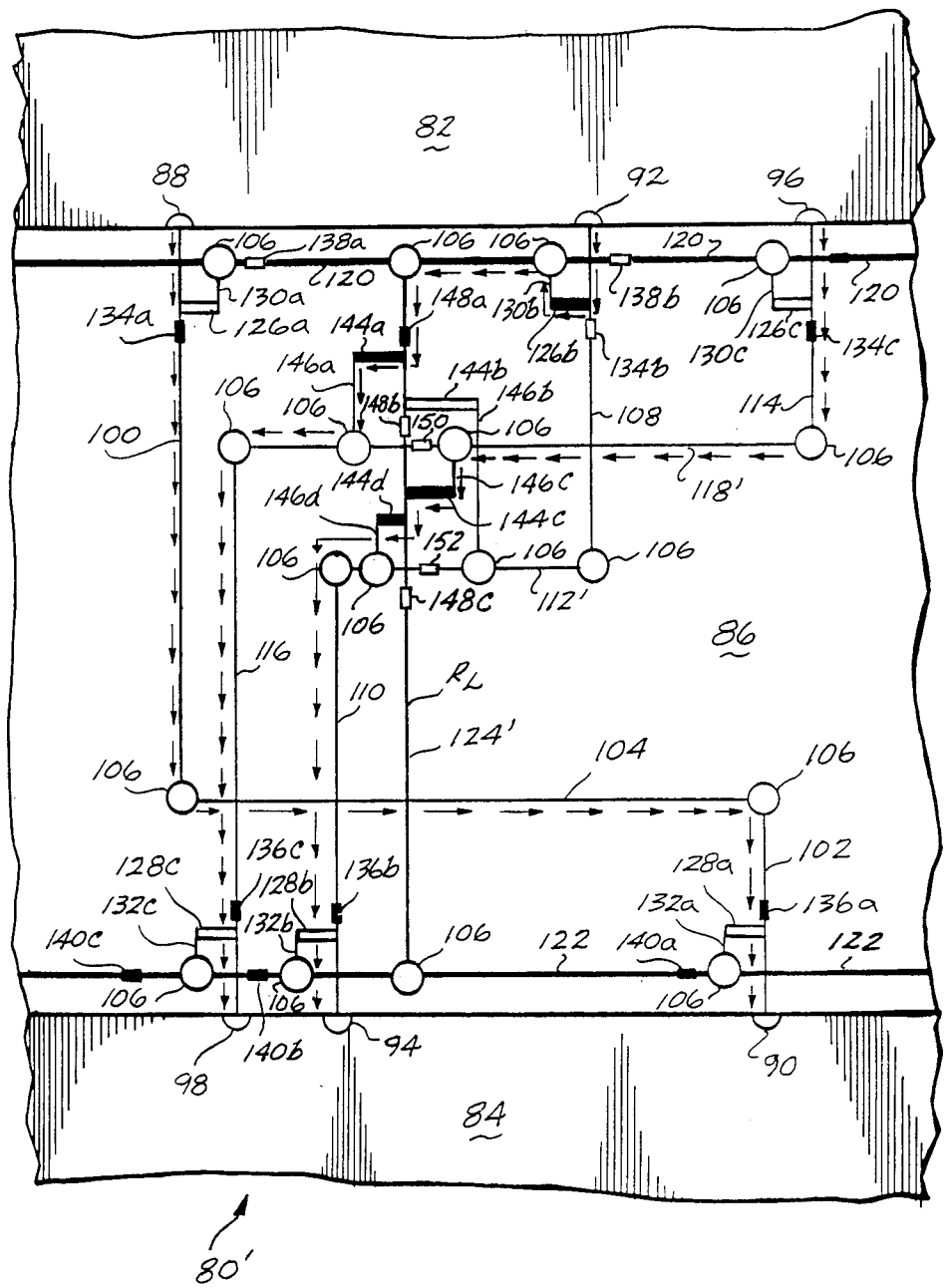
FIG. 6 is a schematic diagram showing how a second embodiment of the rerouting circuit is used to modify the interconnection circuit between the terminals of the two chips.

Yet a further embodiment of integrated circuit 80 is shown in FIG. 6, generally identified at reference numeral 80'. Integrated circuit 80' differs from integrated circuit 80 by providing for multiple connections between a redundant line 124' and second conductors 112' and 118'. In addition, redundant line 124' includes a plurality of switchable disconnectors 148a, 148b, and 148c; second conductor 118' includes a switchable disconnector 150; and second conductor 112' includes a switchable disconnector 152. A switchable connector 144a, a connecting link 146a, and a throughpad 106 adjoin second conductor 118' and redundant line 124'. The redundant line also is joined through switchable connector 144b, connecting link 146b, and throughpad 106, to second conductor 112'. In addition, respective switchable connectors and connecting links 144c and 146c, and 144d and 146d join the redundant line to second conductor 118' and second conductor 112' at two additional points, via throughpads 106. Similar interconnections between the other redundant lines and other first and second conductors are provided, but not shown. In all other respects, integrated circuit 80' is the same as integrated circuit 80, as shown in FIG. 3, at least prior to activation of any of the switchable connectors or switchable disconnectors.

The additional complexity of integrated circuit 80', compared to integrated circuit 80, offers significantly greater opportunity of modify the conductive paths between chips 82 and 84. As a result, it is possible to connect terminal 92 to terminal 98, instead of terminal 94, and terminal 96 to terminal 94, instead of terminal 98. Modification of integrated circuit 80' in this manner might be required to correct a design error in a prototype or to change a circuit parameter, for example, where the original connection shown in FIG. 3 is found to be incorrect.

In the preferred embodiment of integrated circuit 80' shown in FIG. 6, terminal 92 is connected to terminal 98 by activating switchable disconnector 134b and switchable connector 126b. Current can then flow from terminal 92 into a portion of bus conductor 120. That portion of bus conductor 120 is isolated by activating switchable disconnectors 138a and 138b. Current can flow from bus conductor 120 into redundant line 124', through activated switchable connector 144a. Connecting link 146a conveys the current to a portion of second conductor 118' that is connected to first conductor 116. Since first conductor 116 is connected to terminal 98, a conductive path is thus established between terminals 92 and 98.

Switchable disconnector 150 is activated to separate the portion of second conductor 118' through which current can flow between terminals 92 and 98 from another portion carrying current between terminals 94 and 96. First conductor 114 conveys current from terminal 96 into second conductor 118'; however, that current can flow throughy activated switchable connector 144c into a portion of redundant line 124' lying between activated switchable disconnectors 148b and 148c. From that portion of redundant line 124', the current flows through activated switchable connector 144d, and is conveyed by connecting link 146d and throughpad 106 into a portion of second conductor 112' that is connected to first conductor 110. Switchable disconnector 152 is activated to isolate the portion of second conductor 112' that is connected to first conductor 108. First conductor 110 conveys the current into terminal 94, to which it is directly connected.

Figure 7:
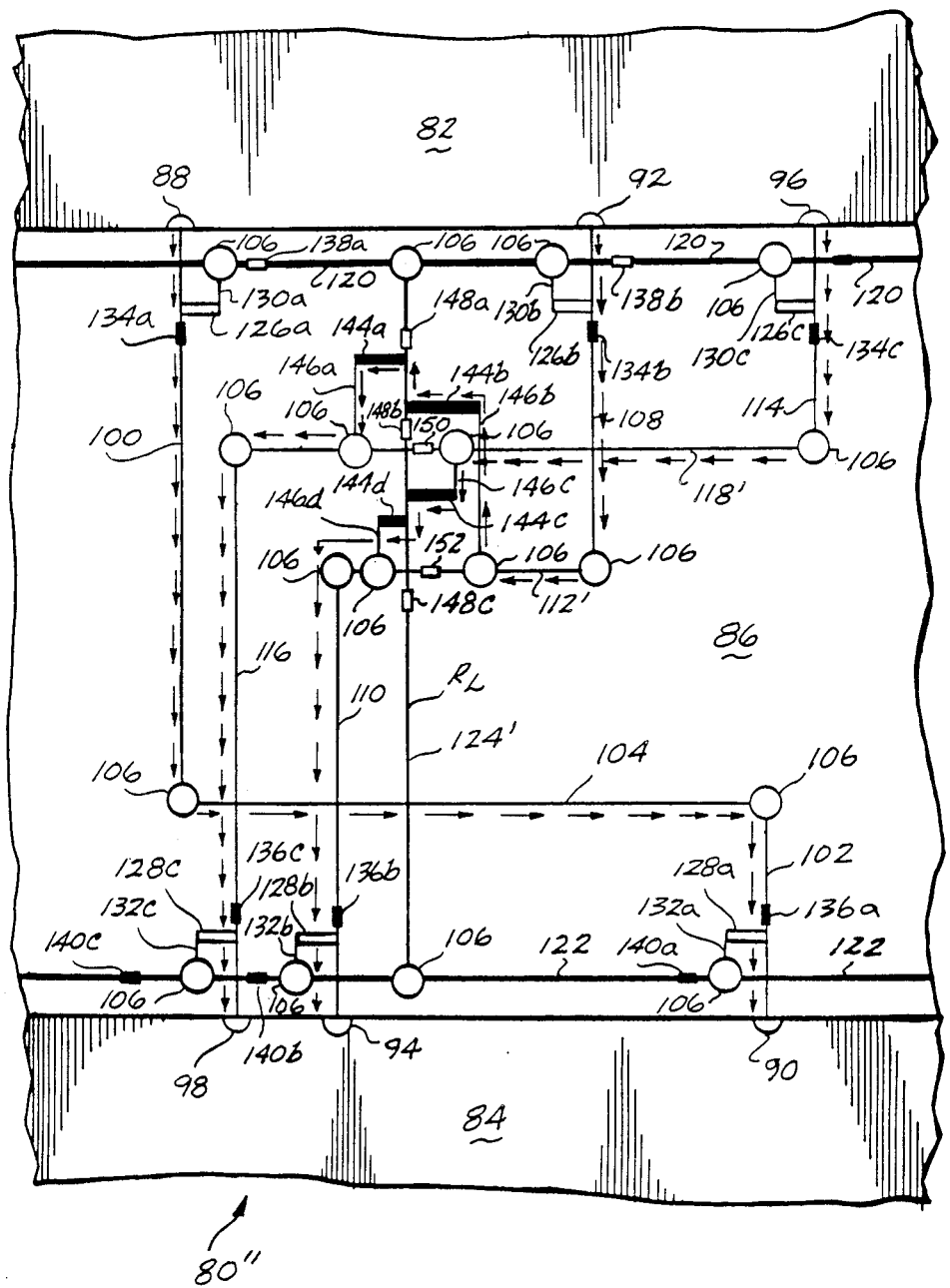
FIG. 7 is a schematic diagram showing an alternative way to use the rerouting circuit of FIG. 6 to modify the interconnection circuit.

FIG. 6 discloses one possible circuit using redundant line 124' and various switchable connectors and disconnectors to change the current carrying paths in an integrated circuit after it is manufactured. It will be apparent to one of ordinary skill in the art that numerous other rerouting circuits may be developed to permit modification of an existing integrated circuit in a manner similar to that disclosed above. For example, in FIG. 7, an alternative use of the rerouting circuit of FIG. 6 is illustrated to show how the same result may be obtained without using bus conductors 120 and 122. FIG. 7 illustrates a portion of an integrated circuit 80" that is identical to the portion of integrated circuit 80' shown in FIG. 6, except for minor changes in the switchable connectors and disconnectors that are activated. The same current path is provided between terminals 94 and 96 in integrated circuit 80" as described above for integrated circuit 80'. However, in integrated circuit 80", switchable connector 126b and switchable disconnectors 134b, 138a, and 138b are not activated. Switchable connectors 144a and 144b, and switchable disconnectors 148a, 148b, and 148c are activated to provide a current path between terminals 92 and 98 that includes: first conductor 108, a portion of second conductor 112', connecting link 146b, switchable connector 144b, a portion of redundant line 124' (between switchable disconnectors 148a and 148b), switchable connector 144a, connecting link 146a, a portion of second conductor 118', and first conductor 116. Throughpads 106 carry current between different planes, as described above. This current path modifies the circuit so that terminal 92 is connected to terminal 98, *without* using bus conductors 120 and 122.

Figure 8:
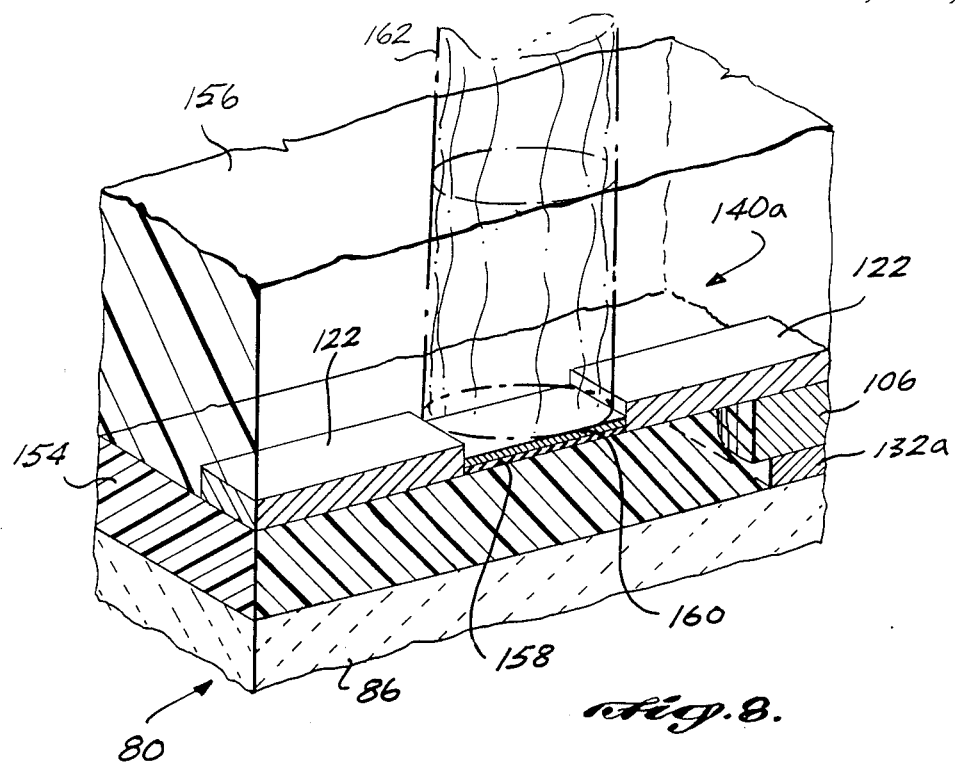
FIG. 8 is an isometric cross section of a portion of a conductive line in the IC of FIG. 3, in which a disconnect region is provided for producing a discontinuity when heated with a laser beam.

Key to the rerouting circuit and the method for rerouting conductive paths between chips or components in an integrated circuit as provided in the present invention is the structure of the switchable connectors and switchable disconnectors. FIG. 8 illustrates an exemplary preferred embodiment of switchable disconnector 140a, which is preferably activated using a focused laser beam to change the switchable disconnector from a conducting state to a non-conducting state. Prior to its activation, switchable disconnector 140a provides a continuous conductive path between the two portions of bus conductor 122. An intermediate insulating layer 154 of silicon oxide, polyimide or other suitable dielectric separates and electrically insulates bus conductor 122 from each of the first conductors, except where joined thereto via throughpads 106. Bus conductor 122 is deposited on insulating layer 154.

Electrical continuity is provided across a gap separating the two portions of bus conductor 122 shown in FIG. 8, through a thin metal film layer 158, which is deposited using conventional vacuum deposition techniques; metal film layer 158 may comprise any good conductive metal such as gold, silver, copper, or alloys thereof. A layer of absorptive insulating material 160, preferably comprising a metallic halide film or a chalcogenide film such as $GeSe_2$ or $As_2S_3$, is deposited on metal film layer 158, and has the capacity to absorb the metal film layer when heated, producing a non-conductive region. Metal film layer 158 and absorptive insulating material 160 thus together comprise a composite layer that is electrically conductive until activated with heat. A focused argon ion laser beam 162 is preferably used to activate the composite layer; however, other types of focused high energy beams may be used to selectively heat it, e.g., an electron beam or x-ray beam.

A dielectric coating material 156 protects the first and second conductors from external physical and electrical contact, and comprises a material transparent to the wavelength of the laser or other focused energy beam used to heat the switchable disconnector to convert it from a conductive to a non-conductive state. For example, polyimide is substantially transparent to the range of wavelengths produced by the argon ion laser preferably used to activate the selected switchable connectors and disconnectors and is thus suitable for use as dielectric coating material 156. As metal film layer 158 is heated, it is absorbed into absorptive insulating layer 160, converting the conductive composite layer to an insulating dielectric, and thereby creating a discontinuity between the two portions of bus conductor 122. Further details of this preferred embodiment of the switchable disconnectors are disclosed in U.S. Pat. No. 4,661,214, and the specification and disclosure of that patent are hereby specifically incorporated herein by reference.

Figure 9:
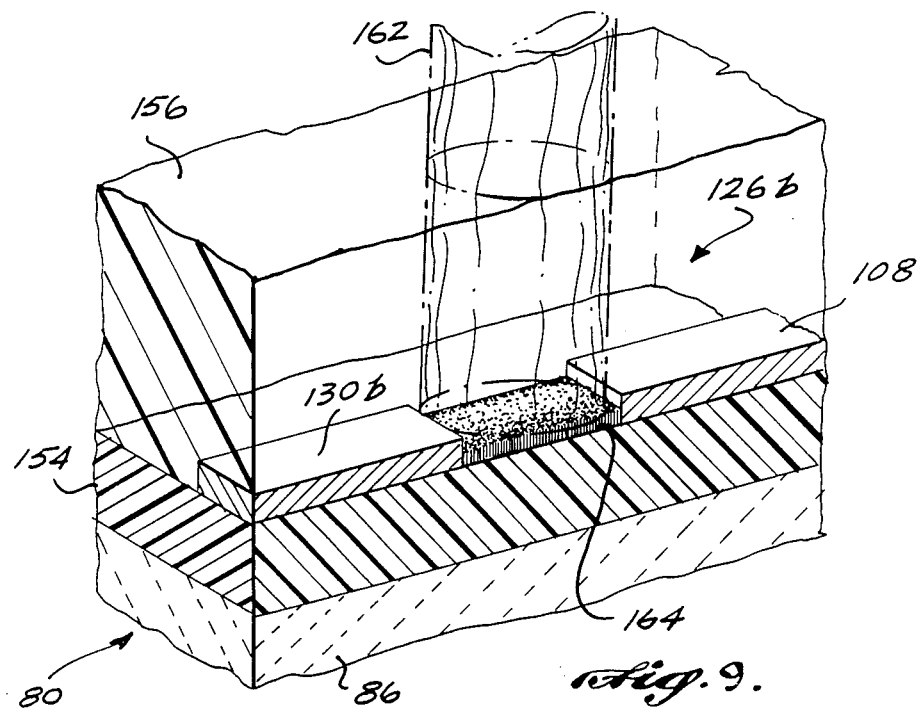
FIG. 9 is an isometric cross section of a portion of a conductive line in the IC of FIG. 3, in which is disposed a dielectric region that is made conductive when heated with a laser beam.

Turning now to FIG. 9, switchable connector 126b is shown in isometric cross section, exemplary of other switchable connectors used in the present invention. Switchable connector 126b includes a non-conductive thin film layer comprising a plurality of microscopic columns 164, which are vacuum deposited on insulating layer 154 between first conductor 108 and linking connector 130b. Columns 164 may comprise a mixture of lead, gold, indium, and other metals having a relatively low melting point, that are sequentially evaporated onto insulating layer 154 using generally conventional masking and vacuum deposition techniques. Since columns 164 are each spacially separated from one another, the thin film layer has good dielectric properties (resistivity greater than $10^8$ ohm-cm) until activated by heating with a focused laser beam 162 or other focused energy beam. The heat melts columns 164, causing them to flow together. Fusion of columns 164 creates continuity between first conductor 108 and linking connector 130b. Details of the method for producing a switchable connector as shown in FIG. 9 are disclosed in U.S. Pat. No. 4,681,778, the specification and disclosure of which are hereby specifically incorporated herein by reference. An alternative method is disclosed in a co-pending, commonly assigned application, Ser. No. 317,739, filed May 25, 1989, entitled STRUCTURE AND METHOD FOR SELECTIVELY PRODUCING A CONDUCTIVE REGION ON A SUBSTRATE.

Integrated circuits 80, 80' and 80" have been disclosed as each comprising a multi-chip module. It should be apparent that the present invention is equally applicable to repair or modify and IC in which a plurality of active or passive components are interconnected, e.g., the components may comprise resistors instead of integral function semiconductor chips.

While the present invention has been described with respect to several preferred embodiments and modifications thereto, it will be understood by those of ordinary skill in the art that further modifications may be made within the scope of the claims that follow. Accordingly, the scope of the invention is to be determined entirely by reference to the claims and not limited by details of the preferred embodiments.

The embodiments of the invention in which an exclusive property or privilege is claimed are defined as follows:

1. In an integrated circuit including at least two components interconnected by a substantial plurality of conductive lines, said conductive lines including a plurality of generally parallel first traces disposed in a first plane, and a plurality of generally parallel second traces disposed in a second plane, said second traces extending generally transverse to the first traces, at least some of the first traces being directly connected to terminals of said two components and interconnected to the second traces at selected points by throughpads that extend between the first and second planes, a repair circuit for correcting a fault in the conductive lines and for modifying a design of the integrated circuit, comprising:
 (a) a first bus conductor extending adjacent to one of the two components, generally transverse to the first traces, and disposed in a different plane than the first traces;
 (b) a second bus conductor extending adjacent to the other of the two components, generally transverse to the first traces, and disposed in a different plane than the first traces;
 (c) a redundant conductor extending generally between said two components, substantially transverse to the second traces and disposed in a different plane than the second traces, said redundant conductor being electrically connected at one end to the first bus conductor and at the other end to the second bus conductor using throughpads, but not directly connected to the components;
 (d) connector means disposed within the integrated circuit, for selectively electrically connecting at least one of the first traces that are connected to said one component, to the first bus conductor, and for selectively electrically connecting at least one of the first traces that are connected to said other component, to the second bus conductor; and
 (e) isolation means for selectively creating an electrical discontinuity in the conductive lines, to electrically isolate at least one of the conductive lines interconnecting the components from the rest of the integrated circuit, and for selectively creating an electrical discontinuity between the connector means at the first bus conductor and between the connector means at the second bus conductor, to isolate one or more sections of said bus conductors from a remainder of the bus conductors, said connector means and said isolation means being selectively used to repair a fault in the conductive lines and to modify the design of the integrated circuit by rerouting a signal between terminals of the components through the redundant conductor and through the first and second bus conductors.

2. The repair circuit of claim 1, wherein the connector means comprise a region of a dielectric film that may be selectively changed from a non-conductive to a conductive state by localized heating using a focused energy beam directed upon said region, said region then providing electrical continuity between a selected first trace and a selected one of the first and second bus conductors.

3. The repair circuit of claim 1, wherein the isolation means comprise a patch formed in the interconnecting conductive lines, said patch comprising a composite layer including a thin conducting layer extending across a gap formed in one of the interconnecting conductive lines and the first and second bus conductors, and an insulating layer that is operative to absorb the conducting layer, changing the composite layer to a non-conductive state when selectively activated by heating the patch with focused energy beam.

4. The repair circuit of claim 1, further comprising additional redundant conductors spaced apart at intervals along the components, one such redundant conductor serving for repair of any fault that occurs in a plurality of the adjacent interconnecting conductive lines.

5. The repair circuit of claim 4, wherein there are at least ten interconnecting conductive lines for each redundant conductor.

6. The repair circuit of claim 2, wherein the first and second bus conductors and the redundant conductor are disposed internally within the integrated circuit, covered by an insulating material that is substantially transparent to the focused energy beam.

7. The repair circuit of claim 3, wherein the first and second bus conductors and the redundant conductor are disposed internally within the integrated circuit, covered by an insulating material that is substantially transparent to the focused energy beam.

8. The repair circuit of claim 1, wherein the first and second bus conductors are disposed within the second plane.

9. The repair circuit of claim 1, wherein the redundant conductor is disposed within the first plane.

10. The repair circuit of claim 1, wherein the integrated circuit comprises a multi-chip module, and wherein the components each comprise integral function chips formed on a common substrate of the multi-chip module.

11. The repair circuit of claim 1, wherein the fault in an interconnecting conductive line comprises one of an open circuit and a short circuit in the first and second traces.

12. The repair circuit of claim 1, wherein the connector means are further operative to selectively connect the redundant conductor to at least one of the second traces.

13. The repair circuit of claim 12, wherein the isolation means are further operative to selectively create an electrical discontinuity in the redundant conductor.

14. An integrated circuit in which a fault in conductors interconnecting components may be repaired and the integrated circuit modified after its fabrication, comprising:
   (a) a substrate on which the conductors are disposed in a plurality of conductor planes; '(b) means for joining a conductor disposed in one conductor plane with a conductor disposed in another conductor plane;
   (c) bus means, disposed adjacent the components in one of the conductive planes, for rerouting a conductive path within said one conductive plane;
   (d) redundant conductor means, for interconnecting the bus means, said redundant connector means extending generally transverse to the bus means and not directly connected to the components;
   (e) connector means, disposed within the integrated circuit, for selectively electrically connecting the redundant conductor means to the conductors at first predetermined points; and
   (f) isolation means, disposed within the integrated circuit, for selectively creating an electrical discontinuity within the bus means, and within the redundant conductor means at second predetermined points, said connector means, isolation means, bus means, and redundant conductor means being usable to repair a break and a short circuit fault in the conductors and to modify the integrated circuit by providing a discrete alternate conductive path between the components through the redundant conductor means.

15. The integrated circuit of claim 14, wherein said bus means include a plurality of the first predetermined points at which the bus means may be connected to the conductors, each of which is associated with a terminal on the components, adjacent first predetermined points in the bus means being separated by a second predetermined point where a discontinuity can be created by the isolation means, so that said isolation means can separate one portion of the bus means that has been connected to a conductor from another portion of the bus means.

16. The integrated circuit of claim 14, wherein the connector means include a plurality of regions comprising a dielectric film that may be selectively changed from a non-conductive to a conductive state when heated with a focused energy beam, each of said regions being connected to said means for joining a conductor.

17. The integrated circuit of claim 14, wherein the isolation means comprise a patch of a composite film disposed at each of the second predetermined points at which the electrical discontinuity may be selectively created, said composite layer including a thin conducting layer extending across a gap formed in one of the conductor and the bus means at that second predetermined point, and an insulating layer that is operative to absorb the conducting layer, changing the composite layer to a non-conductive state when heated with a focused energy beam.

18. The integrated circuit of claim 14, wherein the conductors connect terminals on the components, said bus means extending generally tranversely across conductors that are directly connected to the junctions, but in a different conductive plane.

19. The integrated circuit of claim 18, wherein the redundant conductor means comprise one redundant conductor for a plurality of conductors, said redundant conductor being electrically connected at each of its ends to the bus means.

20. The integrated circuit of claim 19, wherein the redundant conductor lies in the same conductive plane as the conductors directly connected to the terminals of the components, and is generally parallel thereto.

21. The integrated circuit of claim 14, wherein the integrated circuit comprises a multi-chip module, said components comprising separate chips mounted on a common substrate within sadi multi-chip module.

22. The integrated circuit of claim 14, wherein the conductors, and redundant conductor means disposed on the substrate are covered with a dielectric material that is substantially transparent to a focused energy beam having a defined range of wavelengths, said focused energy beam being usable to selectively activate the connector means and the isolation means when directed at specific ones of the first and second predetermined points, respectively.

23. A method of modifying conductive paths and of repairing faults in the conductive paths connecting terminals of two components of an integrated circuit, comprising the step of:
   (a) providing a single redundant conductor for a plurality of the conductive paths connecting the two components, said redundant conductor extending substantially transversely to and being connected between bus conductors disposed adjacent each of the two components, and thus not directly connected to the terminals of the components;
   (b) creating an electrical discontinuity in a selected first conductor comprising one of the conductive paths, to isolate at least a portion of it from the rest of the integrated circuit; and
   (c) electrically connecting selected second conductors that are connected to the terminals of the components to the redundant conductor through at least one of the bus conductors so that the terminal of one component is connected to the terminal of the other component through the redundant conductor and at least one of the bus conductors, instead of through one of the conductive paths originally fabricated to carry current between the terminals of the components.

24. The method of claim 23, wherein the bus conductors are initially electrically isolated from the second conductors connected to the components, further comprising the step of electrically connecting the selected second conductors connected to the terminals of at least one of the components to each other through at least one of the bus conductors and the redundant conductor, to first create the conductive paths.

25. The method of claim 23, wherein the integrated circuit includes a plurality of regions of a dielectric film that may be changed from a non-conductive to a conductive state by heating, said step of electrically connecting comprising the step of directing a focused energy beam on selected regions to heat them, causing them to become conductive.

26. The method of claim 23, wherein the integrated circuit includes a plurality of patches comprising a composite layer that includes a thin conducting layer extending across a break in the conductors, and an insulating layer operative to absorb the conducting layer, changing the composite layer to a non-conductive state when heated, said step of creating an electrical discontinuity comprising the step of directing a focused energy beam on selected patches to heat them.

27. The method of claim 24, further comprising the step of creating an electrically discontinuity in the bus conductors to separate a portion of the bus conductor connected to one of the second conductors from the rest of that bus conductor.

28. The method of claim 23, wherein the step of creating an electrical discontinuity and the step of electrically connecting are accomplished internally within the integrated circuit, following its initial fabrication, said integrated circuit including a coating of dielectric material that is substantially transparent to a focused energy beam having a wavelength within a defined range.

29. The method of claim 23, further comprising the step of electrically connecting the redundant conductor to a selected third conductor not directly connected to a terminal.

30. The method of claim 23, wherein the step of creating an electrical discontinuity comprises the step of electrically isolating a portion of at least one conductive path that is shorted to another conductive path from the rest of the integrated circuit.

* * * * *

UNITED STATES PATENT AND TRADEMARK OFFICE
CERTIFICATE OF CORRECTION

PATENT NO. : 4,974,048
DATED : November 27, 1990
INVENTOR(S) : Chakravorty et al.

It is certified that error appears in the above-identified patent and that said Letters Patent is hereby corrected as shown below:

| | |
|---|---|
| Column 1, line 20 | "usuable" should be --unusable--- |
| Column 5, line 57 | "141a" should be --140a-- |
| Column 6, line 2 | "all" should be --all-- |
| Column 9, line 19 | "throughy" should be --through-- |
| Column 9, line 50 | "not" should be --not-- |
| Column 13, line 9 (Claim 14) | "(b)" should be --(b)-- (new paragraph) |
| Column 14, line 13 (Claim 21) | "sadi" should be --said-- |
| Column 15, line 5 (Claim 27) | "electrically" should be --electrical-- |

Signed and Sealed this

Third Day of March, 1992

*Attest:*

HARRY F. MANBECK, JR.

*Attesting Officer*  *Commissioner of Patents and Trademarks*